United States Patent
Driemel

(10) Patent No.: US 10,379,178 B2
(45) Date of Patent: Aug. 13, 2019

(54) TILTABLE HEAD COIL

(71) Applicant: Daniel Driemel, Oederan (DE)

(72) Inventor: Daniel Driemel, Oederan (DE)

(73) Assignee: SIEMENS AKTIENGESELLSCHAFT, München (DE)

( * ) Notice: Subject to any disclaimer, the term of this patent is extended or adjusted under 35 U.S.C. 154(b) by 914 days.

(21) Appl. No.: 14/809,217

(22) Filed: Jul. 25, 2015

(65) Prior Publication Data

US 2016/0025823 A1  Jan. 28, 2016

(30) Foreign Application Priority Data

Jul. 25, 2014  (DE) .................. 10 2014 214 704

(51) Int. Cl.
*G01R 33/34* (2006.01)
*A61B 5/055* (2006.01)

(52) U.S. Cl.
CPC .. *G01R 33/34007* (2013.01); *G01R 33/34084* (2013.01)

(58) Field of Classification Search
CPC .............. G01R 33/34; G01R 33/34007; G01R 33/34084; G01R 33/34046; G01R 33/3415; G01R 33/34092; G01R 33/3642; A61B 5/055; A61B 5/0555
See application file for complete search history.

(56) References Cited

U.S. PATENT DOCUMENTS

| | | | |
|---|---|---|---|
| 9,250,302 B2 * | 2/2016 | Driemel ................. | G01R 33/28 |
| 2005/0127914 A1 | 6/2005 | Eberler et al. | |
| 2010/0032545 A1 * | 2/2010 | Bernloehr ............. | B63H 20/08 248/640 |
| 2010/0185198 A1 * | 7/2010 | Piferi ............... | G01R 33/34046 606/54 |
| 2012/0286784 A1 * | 11/2012 | Driemel .......... | G01R 33/34007 324/318 |
| 2013/0023756 A1 | 1/2013 | Driemel et al. | |
| 2013/0184563 A1 * | 7/2013 | Driemel ............... | A61B 5/0555 600/415 |
| 2015/0057527 A1 | 2/2015 | Driemel | |

FOREIGN PATENT DOCUMENTS

| | | |
|---|---|---|
| DE | 10314215B4 B4 | 11/2006 |
| DE | 102011075454A1 A1 | 11/2012 |
| DE | 102011079565A1 A1 | 1/2013 |
| DE | 102011079575A1 A1 | 1/2013 |
| DE | 102013216686A1 A1 | 2/2015 |

OTHER PUBLICATIONS

German Office Action for German Application No. 10 2014 214 704.2, dated Apr. 29, 2015, with English Translation.

* cited by examiner

*Primary Examiner* — Son T Le
(74) *Attorney, Agent, or Firm* — Lempia Summerfield Katz LLC

(57) ABSTRACT

A head coil for an imaging magnetic resonance tomography (MRT) system is provided. The head coil includes a head coil upper part and a head coil lower part. The head coil lower part includes a lower part base and a movable lower part that may be moved relative to one another via a mechanism for setting a tilt angle.

18 Claims, 10 Drawing Sheets

TILTABLE HEAD COIL

This application claims the benefit of DE 10 2014 214 704.2, filed on Jul. 25, 2014, which is hereby incorporated by reference in its entirety.

BACKGROUND

The present embodiments relate to a head coil for an imaging magnetic resonance tomography (MRT) system.

Magnetic resonance devices (MRTs) for examining objects or patients using magnetic resonance tomography are known, for example, from DE 103 14 215 B4.

SUMMARY

The scope of the present invention is defined solely by the appended claims and is not affected to any degree by the statements within this summary.

The present embodiments may obviate one or more of the drawbacks or limitations in the related art. For example, a head coil is optimized.

DETAILED DESCRIPTION

Figure 10:
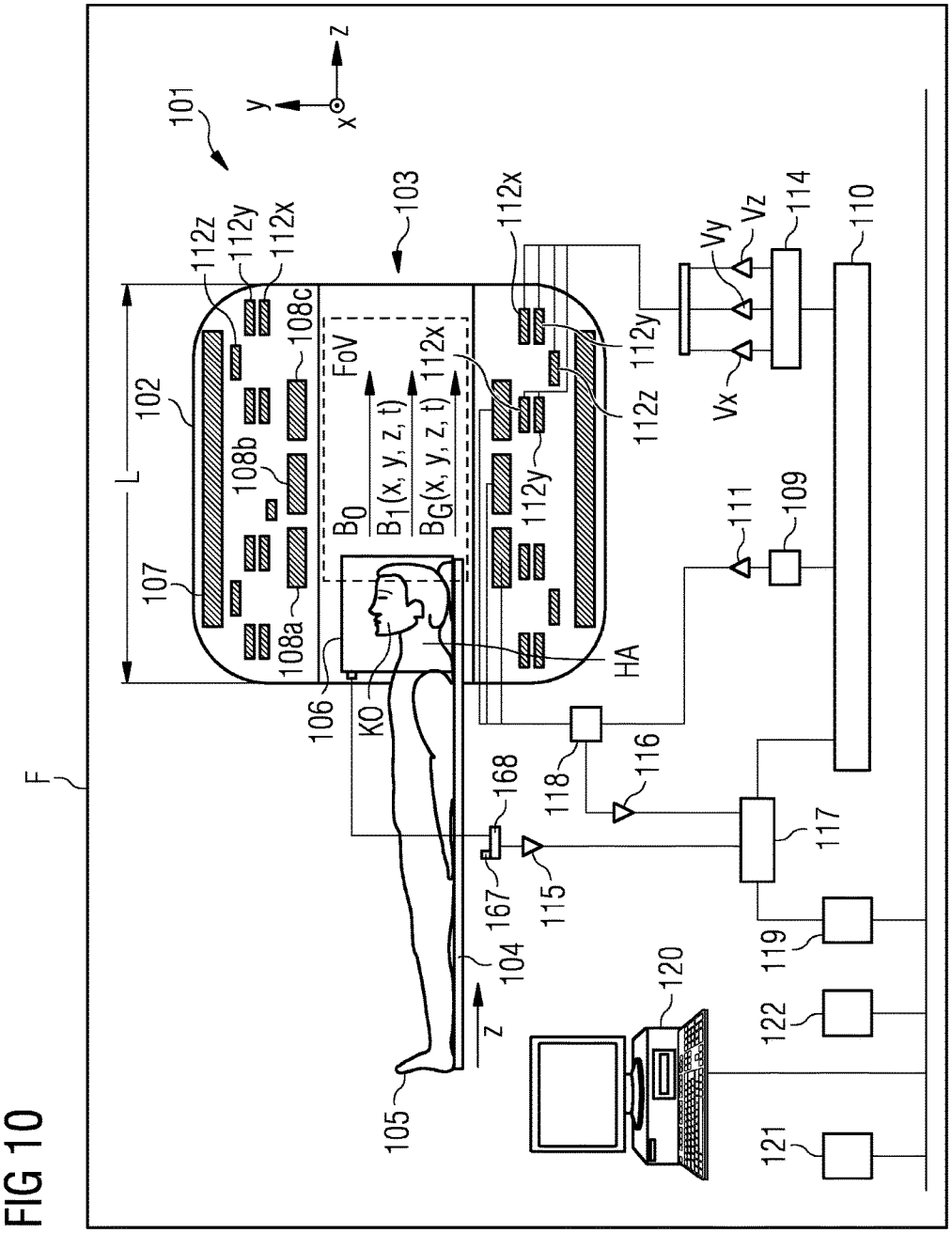
FIG. 10 is a schematic diagram of one embodiment of a magnetic resonance tomography (MRT) system.

FIG. 10 shows one embodiment of an imaging magnetic resonance device MRT 101 (e.g., present in a shielded space or Faraday cage F) with a hollow cylinder 102 having, for example, a tubular space 103 into which a patient couch 104 holding a body 105 (e.g., of an examination object (of a patient); with or without local coil arrangement 106) may be moved in the direction of the arrow z in order to generate recordings of the patient 105 using an imaging method. Arranged on the patient is, for example, a local coil arrangement 106 that may be used in a local region (e.g., field of view (FOV)) of the MRT to generate recordings of a subregion of the body 105 in the FoV. Signals from the local coil arrangement 106 may be evaluated (e.g., be converted to images, stored or displayed) by an evaluation facility (e.g., including elements 168, 115, 117, 119, 120, 121 etc.) of the MRT 101 that may be connected, for example, via coaxial cables or wirelessly (e.g., element 167) to the local coil arrangement 106.

In order to use a magnetic resonance device MRT 101 to examine a body 105 (e.g., an examination object or a patient) using magnetic resonance imaging, different magnetic fields, the temporal and spatial characteristics of which are coordinated as precisely as possible with one another, are radiated onto the body 105. A powerful magnet (e.g., a cryomagnet 107) in a measuring cabin with a, for example, tunnel-like opening 103 generates a powerful static main magnetic field $B_0$ of, for example, 0.2 Tesla to 3 Tesla or even more. A body 105 to be examined is supported on a patient couch 104 and moved into an approximately homogeneous region of the main magnetic field B0 in the field of view FoV. Nuclear spins of atomic nuclei of the body 105 are excited via magnetic high-frequency excitation pulses B1 (x, y, z, t) radiated in via a high-frequency antenna illustrated here in a highly simplified manner as a body coil 108 (e.g., a multipart body coil 108a, 108b, 108c; and/or in some instances via a local coil arrangement). High-frequency excitation pulses are generated, for example, by a pulse generation unit 109 that is controlled by a pulse sequence control unit 110. After amplification by a high-frequency amplifier 111, the high-frequency excitation pulses are directed to the high-frequency antenna 108. The high-frequency system shown is only illustrated schematically. More than one pulse generation unit 109, more than one high-frequency amplifier 111 and a number of high-frequency antennas 108 a, b, c may, however, be used in a magnetic resonance device 101.

The magnetic resonance device 101 also includes gradient coils 112x, 112y, 112z that are used during measuring to radiate in magnetic gradient fields $B_G$ (x, y, z, t) for selective layer excitation and for the spatial encoding of the measuring signal. The gradient coils 112x, 112y, 112z are controlled by a gradient coil control unit 114 (e.g., in some instances, by way of amplifiers Vx, Vy, Vz) that, like the pulse generation unit 109, is connected to the pulse sequence control unit 110.

Signals emitted by the excited nuclear spins (e.g., of the atomic nuclei in the examination object) are received by the body coil 108 and/or at least one local coil arrangement 106, amplified by assigned high-frequency preamplifiers 116, and further processed and digitized by a receive unit 117. The recorded measurement data is digitized and stored as complex numerical values in a k-space matrix. An associated MR image may be reconstructed from the value-populated k-space matrix by a multidimensional Fourier transform.

For a coil that may be operated in both transmit and receive mode (e.g., the body coil 108 or a local coil 106), correct signal forwarding is regulated by an upstream duplexer 118.

An image processing unit 119 uses the measurement data to generate an image that is displayed to a user via an operating console 120 and/or stored in a storage unit 121. A central computer unit 122 controls the individual system components.

FIGS. 1-10 show details of exemplary configurations.

In MR tomography, images with a high signal to noise ratio (SNR) may currently be recorded using local coils. The local coils are antenna systems positioned in direct proximity, for example, on (e.g., anterior) or below (e.g., posterior) the patient. During the course of an MR measurement, the excited nuclei induce a voltage in the individual antennas of the local coil. The induced voltage is then amplified using a low-noise preamplifier (e.g., LNA, Preamp) and forwarded to the receive electronics by cable. High field systems (e.g., 1.5 T to 12 T or more) are also used to improve the signal to noise ratio even with high-resolution images. As more individual antennas may be connected to an MR receive system than there are receivers present, a switching matrix (e.g., RCCS) is incorporated between receive antennas and receivers. This routes the currently active receive channels (e.g., the receive channels in the field of view of the magnet at the time) to the receivers present. This allows more coil elements to be connected than there are receivers present (e.g., as in the case of whole body coverage, only the coils present in the FoV or in the homogeneity volume of the magnet are to be read out).

A local coil 106 (e.g., coil) refers, for example, to an antenna system that may be made up of one or a number of antenna elements (e.g., coil elements; array coil). These individual antenna elements may be embodied as loop antennas (e.g., loops), butterfly coils or saddle coils. A coil includes, for example, the coil elements, the preamplifier, further electronic elements (e.g., baluns, etc.) and cabling, the housing, and may include a cable with plug that connects the coil to the MR system 101. A receiver 168 (RX) on the system side filters and digitizes signals received by the local coil 106 and forwards the data to the digital signal processor 117, 110, which may derive an image or spectrum from the measurement and makes the image or spectrum available to a user of the MRT 101.

Head coils 106 (e.g., for recording images of the head KO of a patient 104, or combined local head/neck coils 106 for recording images of the head KO and neck HA of a patient 104) are intended to improve patient comfort or to support patients with morbid changes to the cervical vertebrae (e.g., ankylosing spondylitis, torticollis, inter alia) tilted at angles in relation to the patient bed. A mechanism that establishes and sets a tilt angle in a reproducible manner is provided. This is discussed, for example, with reference to an ankylosing spondylitis adapter in DE 10 2011 079 575 A1. One or more of the present embodiments relate to an alternative approach.

Known head coils plugged in directly (e.g., with a fixed plug connection between the local coil and the patient couch) may not be tilted in the manner of one or more of the present embodiments. Head coils with a flexible connecting line may be positioned on wedge-shaped pillows or used with an ankylosing spondylitis adapter, for example.

Figure 1:
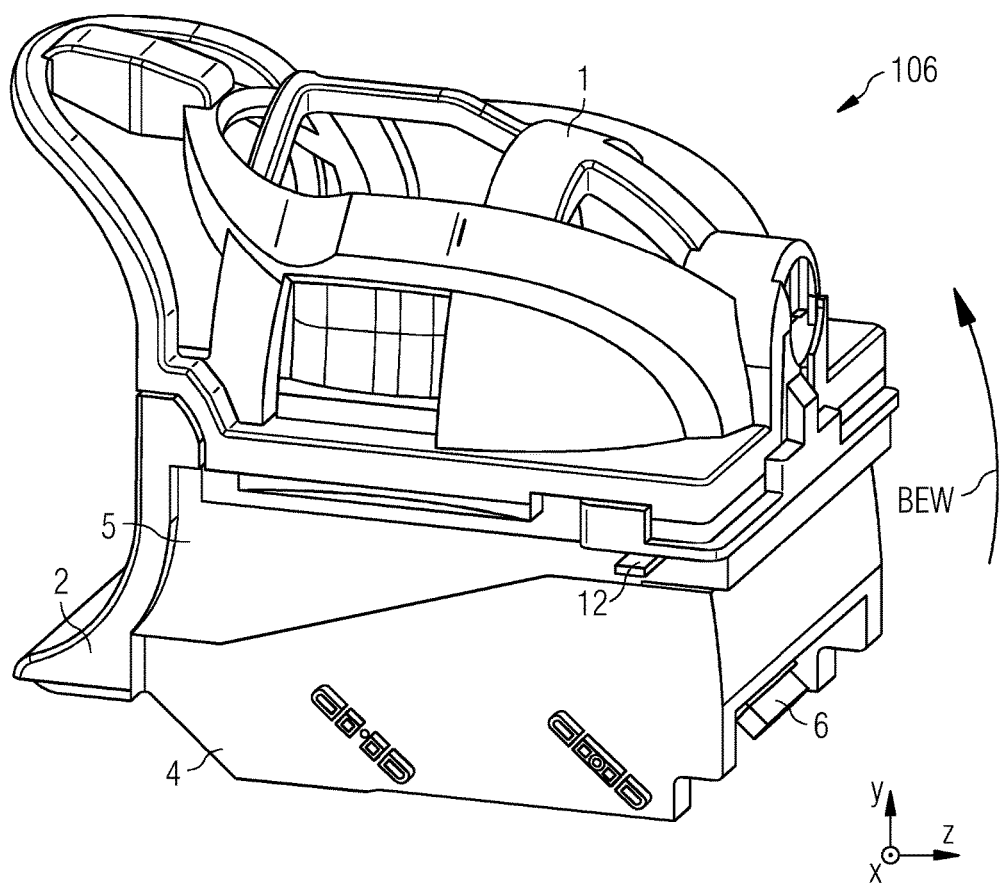
FIG. 1 shows a side view of a non-tilted arrangement of one embodiment of a head coil.

FIG. 1 shows one embodiment of a configuration of an MRT head coil 106, divided into a head coil upper part 1 and a head coil lower part 2, and a mechanism for setting the tilt angle and locking the position. The head coil lower part 2 is made up of a lower part base 4 and a movable lower part 5.

The head coil lower part 2 may be positioned, for example, on the movable lower part 5, after the head KO of a patient 105 or dummy has been positioned on the movable lower part, and may then be located above the head.

The lower part base 4 includes the direct plug-in unit 6 for plugging in and connection to a patient couch 104 and, when plugged in 6, may not be moved relative to the patient couch 104.

The movable lower part 5 is supported in the pivot point 7 (e.g., of an axis or rod or articulation) such that the movable lower part 5 may be rotated relative to the lower part base 4 on and within the lower part base 4.

Figure 2:
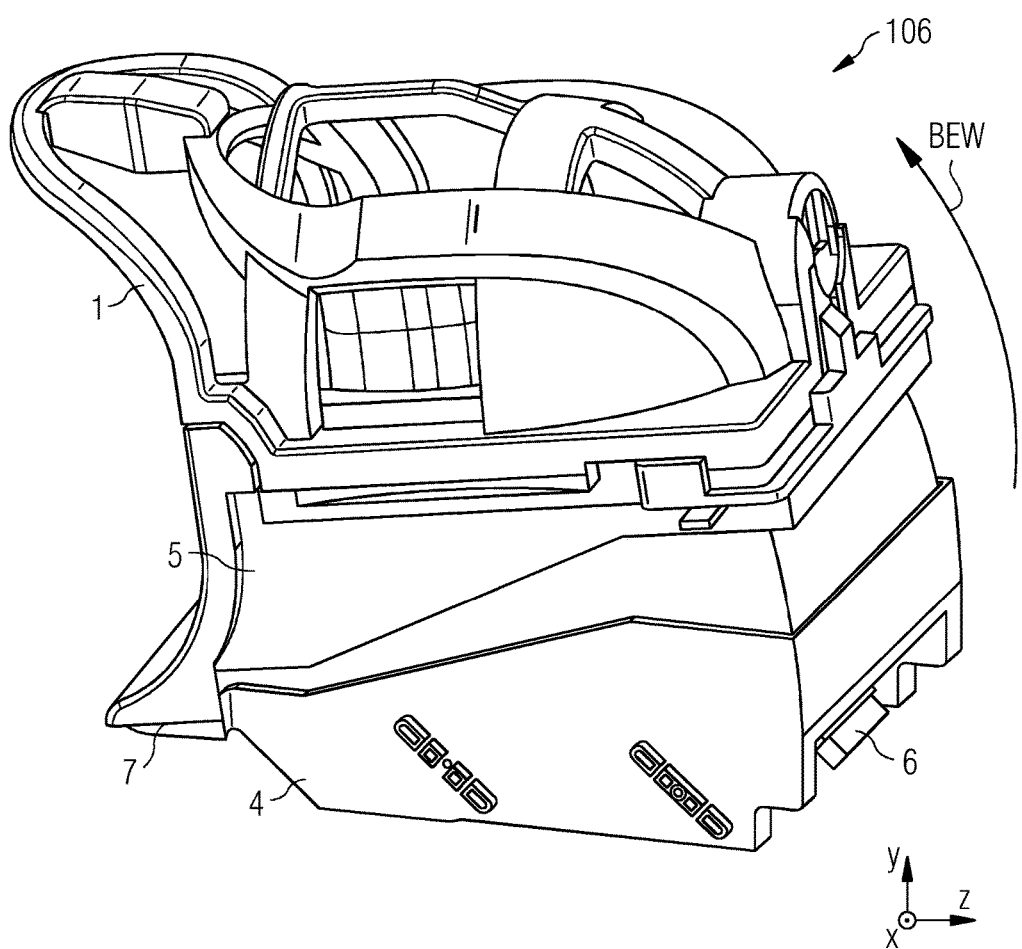
FIG. 2 shows a side view of a tilted arrangement of one embodiment of a head coil.

FIG. 2 shows one embodiment of a configuration of an MRT head coil 106, as in FIG. 1, but with the movable lower part 5 (e.g., with the head coil upper part 1) in a tilted position (e.g., in the direction of the arrow BEW about the axis 7 compared with the position in FIG. 1) relative to the lower part base 4.

Figure 3:
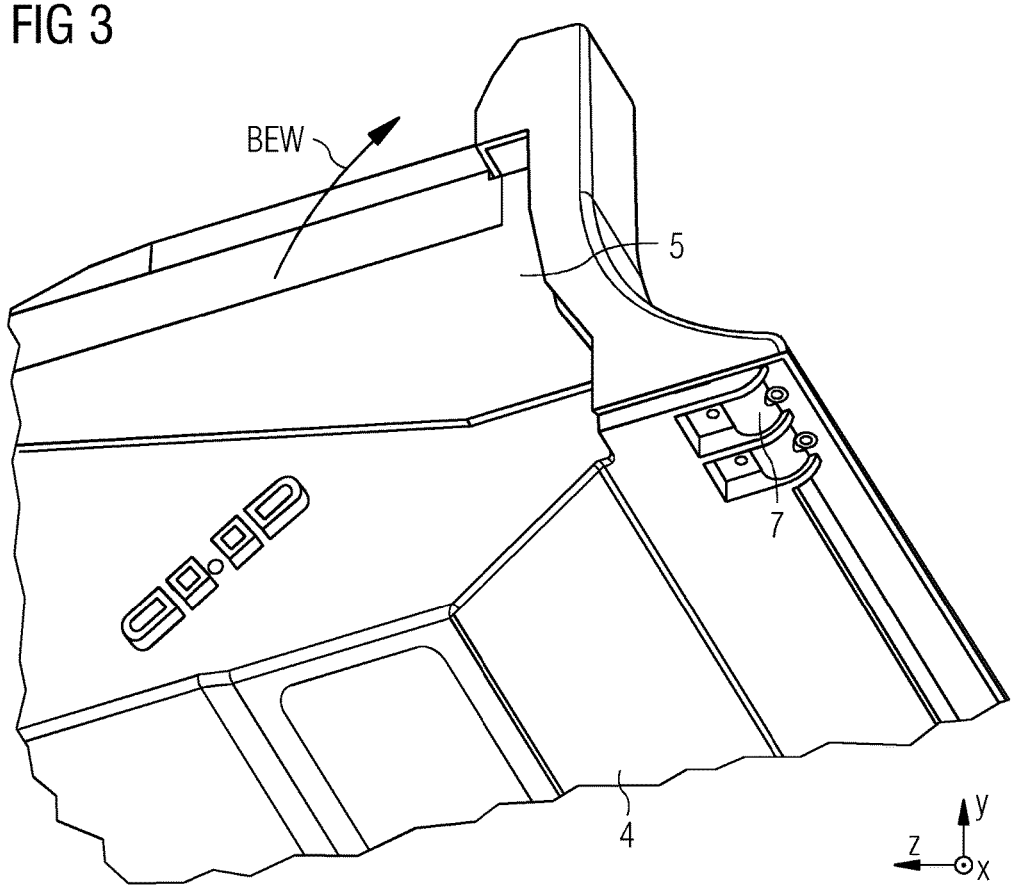
FIG. 3 shows an oblique side view of a mechanism for tilting one embodiment of a head coil.

FIG. 3 shows a mechanism for tilting (e.g., the movable lower part 5 on the lower part base 4) in one embodiment of a head coil 106 with pivot joints on an axis 7 in an oblique side view from below.

Figure 4:
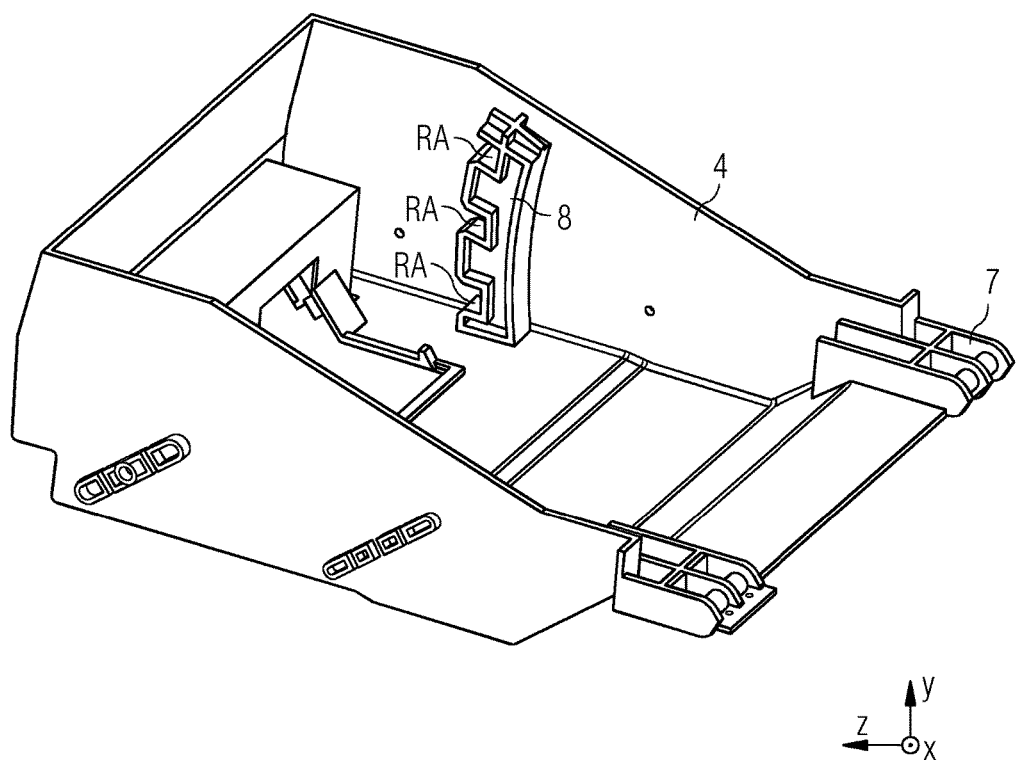
FIG. 4 shows one embodiment of a base element with latching recesses of a latching arrangement in an oblique side view from above into a lower part base of a head coil lower part.

FIG. 4 shows one embodiment of a lower part base 4 with a base element 8 of a mechanism 3 for setting the tilt angle and locking.

Figure 5:
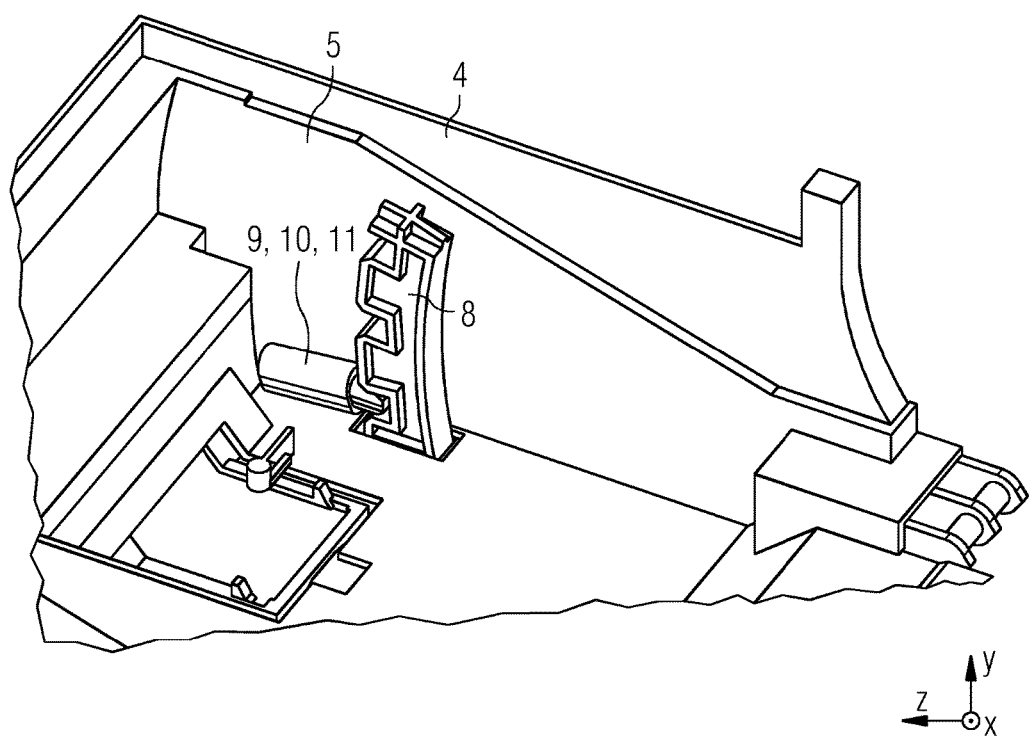
FIG. 5 shows one embodiment of a base element of a latching arrangement in an oblique side view from above into a movable lower part on and in a lower part base of a head coil lower part.
Figure 6:
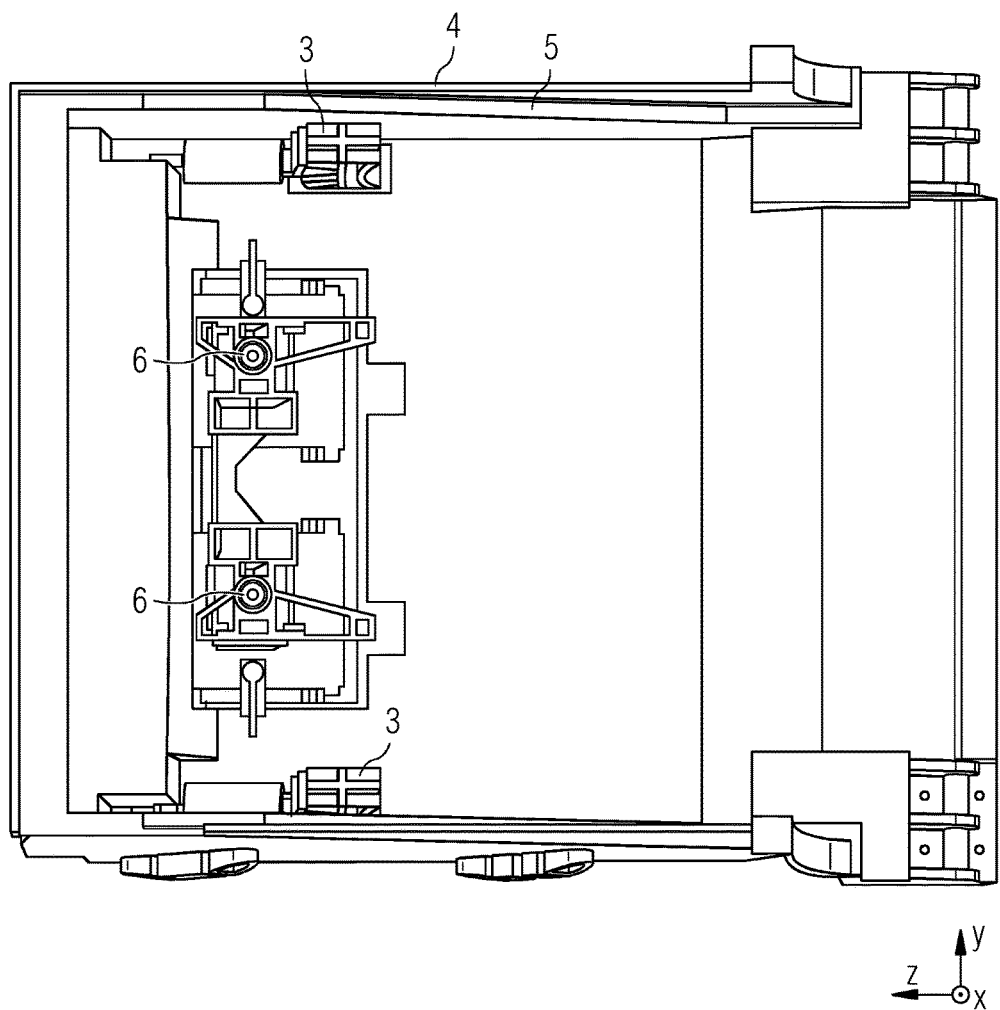
FIG. 6 shows one embodiment of a latching arrangement in a plan view from above into a movable lower part on and in a lower part base of a head coil lower part.

As shown in FIG. 5, a mechanism 3 for setting the tilt angle and locking (e.g., for locking to the lower part base 4) includes a base element 8, and on the movable lower part 5, a latching pin 9 and a guide 10.

For example, a mechanism 3 according to FIGS. 4 and 5 may be arranged in proximity to one (or according to FIG. 6, on both) of the side walls on the base side of the lower part base 4.

Figure 7:
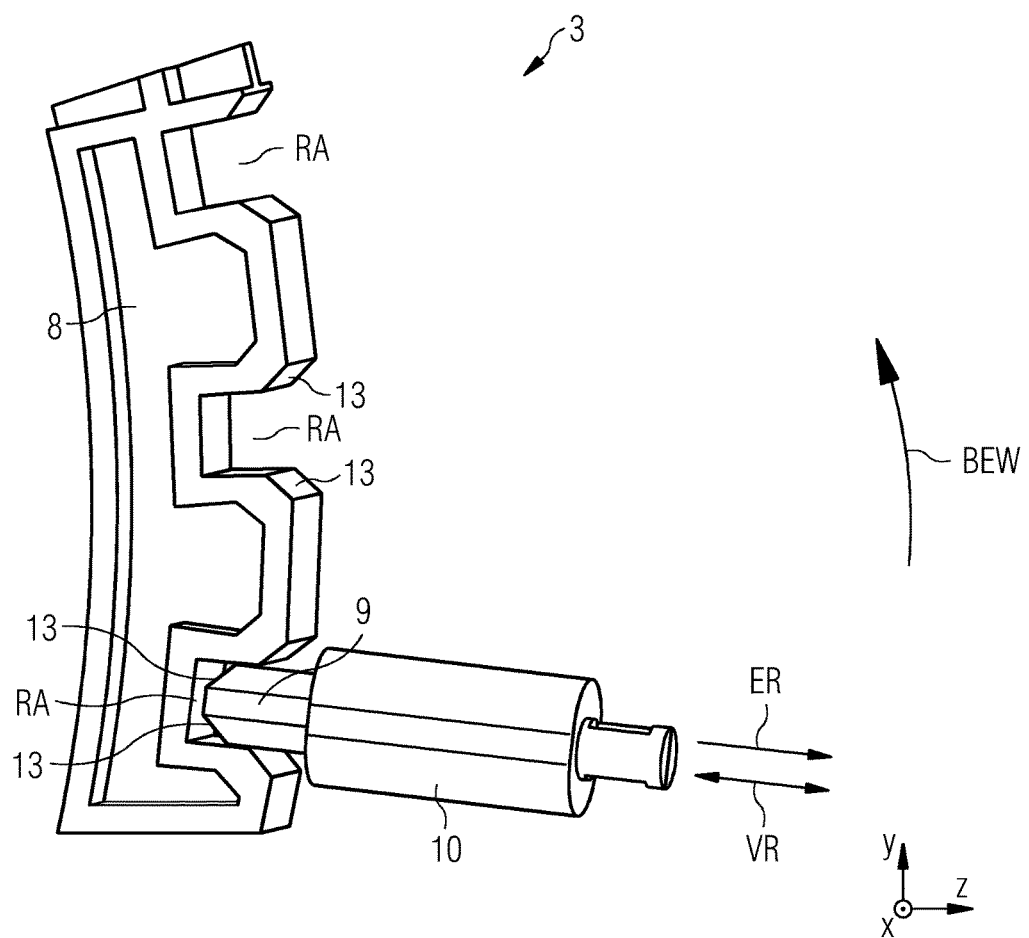
FIG. 7 shows a side view of one embodiment of a latching arrangement.

FIG. 7 shows a side view of an enlarged detail of one embodiment of a base element 8, a latching pin 9, and a guide 10.

The example in FIG. 7 shows the mechanism with three latching positions (e.g., in three latching recesses RA). However, there may be two or more than three latching positions.

Figure 8:
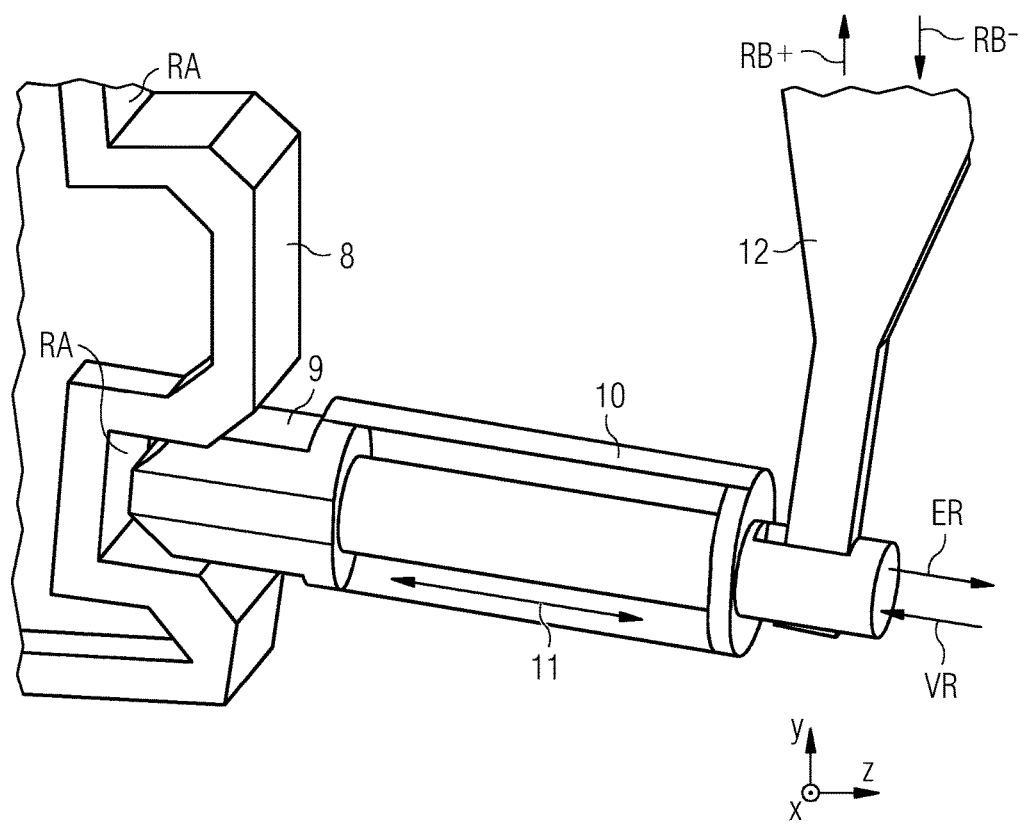
FIG. 8 shows a partially sectional side view of one embodiment of a latching arrangement with an operating lever.
Figure 9:
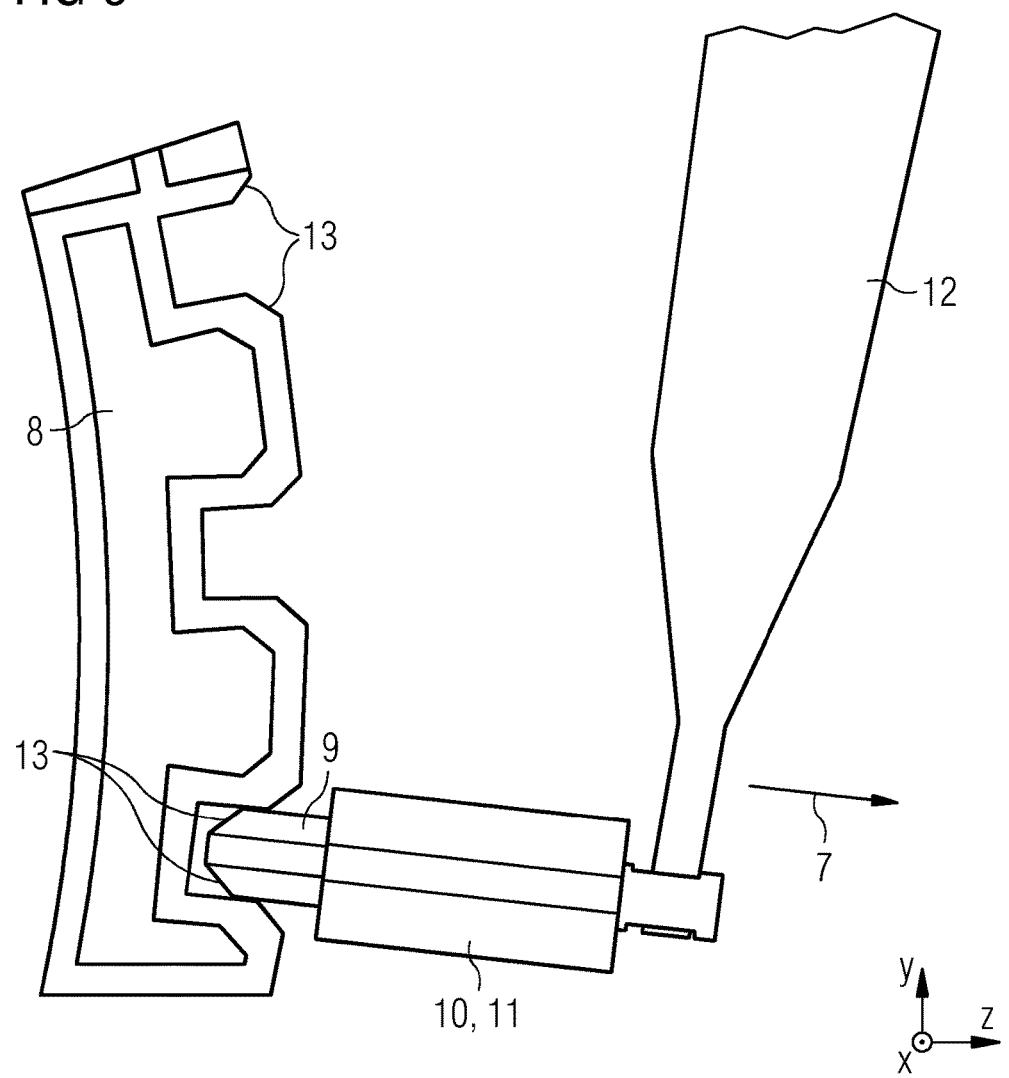
FIG. 9 shows a side view of one embodiment of a latching arrangement with an operating lever.

In FIG. 8, the latching pin 9 is passed in a linear manner through a guide 10 and pressed against the base element 8 by a compression spring 11. At least one base element 8 is connected permanently, for example, by a screw connection or latched with a form fit to the lower part base 4 (e.g., in at least one of the positions in FIGS. 4, 5, 6).

In FIG. 5, the guide 10 or latching pin 9 of the mechanism 3 is fastened (e.g., screwed) to the movable lower part 5 and is moved with this, being driven, for example, when the operator raises the movable lower part 5 or in a downward direction due to gravity.

The latching pin 9 finds a latching position (e.g., in a latching recess RA) in the base element 8 (e.g., projecting from below into the movable lower part 5 through at least one recess in the movable lower part 5), because the latching pin 9 is pressed constantly by the compression spring 11 in the direction VR against the base element 8.

According to FIG. 8, the locking (e.g., of the latching pin 9 in a latching recess RA of the base element 8) is unlocked in the direction of the arrow ER by (e.g., of movement in the direction RB+ or RB− or obliquely thereto) an operating lever 12 that moves the latching pin 9 against the compression spring 11, thereby disengaging the latching position. During upward or downward movement (e.g., RB+ or RB−), the latching pin 9 will engage automatically in the next latching position RA. For easier position location, the latching positions RA in the base element 8 and the latching pin 9 are provided with chamfers 13 (e.g., gradients and/or rounded sections of any length) on latching recesses RA of the base part 8.

This is advantageous if the entire latching mechanism is not positioned centrally in the local coil 106, for example, for space reasons (e.g., as when the direct plug-in unit 6 is plugged directly into a connector on the patient couch 104) but is positioned to the left and right. The two latching mechanisms 3 (e.g., in FIG. 6) may then latch in synchronously. In this instance, the chamfers (13) make a significant contribution by compensating for tolerances between the left and right sides.

Advantages may be, for example, an MRT head coil 106 with tilt angle setting and position locking that may be plugged into and brought into contact easily with a patient couch 104 by a direct plug-in connection. At least two angular positions may be provided during tilting. Latching positions for reproducible examinations may be provided. Locked latching positions may be provided. Locking of a latching position with the advantage that the head coil 106 does not change tilt angle when pulled out of the direction connection may be provided. Therefore, the pivot joint and latching mechanism do not have to be overloaded when the head coil is removed from the patient couch. With regard to locking, when the head coil is handled away from the patient couch, there is no unwanted tilting movement of the head coil. Self-locating latching positions driven by a compression spring may be provided.

Insertion gradients (e.g., chamfers 13) for better position location may be provided. A duplicated tilting mechanism (e.g., to the left and right for optimum load distribution and stability), for example, when there is a lack of space in the center of the head coil (e.g., as with a direct plug-in) may be provided. With the duplicated mechanism 3, tolerance compensation by chamfers 13 for synchronous latching on both sides may be provided.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A head coil for an imaging magnetic resonance tomography (MRT) system, the head coil comprising:
   a head coil upper part;
   a head coil lower part comprising a housing; and
   a mechanism for setting a tilt angle and locking, the mechanism at least partially disposed within the housing of the head coil lower part,
   wherein the head coil lower part comprises a lower part base and a movable lower part that are movable relative to one another via the mechanism, and
   wherein the mechanism comprises a base element, a latching pin, and a guide.

2. The head coil of claim 1, wherein the lower part base comprises a direct plug-in unit, the lower part base being fixable to a patient couch and contacts of the direct plug-in unit being connectable to contacts on a patient couch with the direct plug-in unit.

3. The head coil of claim 1, wherein the movable lower part is supported in a pivot point such that the movable lower part is rotatable relative to the lower part base.

4. The head coil of claim 1, wherein the latching pin is passed in a linear manner through the guide of the mechanism for setting the tilt angle and locking.

5. The head coil of claim 1, wherein in the guide of the mechanism for setting the tilt angle and locking, the latching pin is pressed against a base element of the mechanism by a compression spring.

6. The head coil of claim 1, wherein the mechanism for setting the tilt angle and locking has two, three, or more than three latching positions.

7. The head coil of claim 1, wherein the base element is configured as fixed to the lower part base.

8. The head coil of claim 7, wherein the base element is configured as fixed to the lower part base by a screw connection or being latched therein with a form fit.

9. The head coil of claim 1, wherein a part of the mechanism is fastened to the movable lower part.

10. The head coil of claim 9, wherein the guide of the mechanism is fastened to the movable lower part.

11. The head coil of claim 1, wherein the mechanism together with the lower part is movable in an upward direction by raising the movable lower part, in a downward direction due to gravity, or a combination thereof.

12. The head coil of claim 1, wherein the latching pin of the mechanism is latchable into a latching position in the base element by a compression spring that presses against the base element during movement of the latching pin along the base element.

13. The head coil of claim 12, further comprising an operating lever, the operating lever configured to unlock the locking of the latching pin in the base element, the operating lever allowing the latching pin to be moved against the compression spring.

14. The head coil of claim 1, further comprising insertion gradients in the form of chamfers provided on the base element, on the latching pin, or on a combination thereof.

15. The head coil of claim 14, wherein the insertion gradients improve engagement of the base element and the latching pin relative to one another in a latching position.

16. The head coil of claim 1, wherein the mechanism with the base element and the latching pin is arranged centrally in the local coil or to a side in the local coil.

17. The head coil of claim 1, wherein the mechanism is a first latching element, and
   wherein the head coil further comprises a second latching element, the first latching element and the second latching element being arranged in the local coil.

18. The head coil of claim 1, wherein the head coil is a head coil for recording images of just the head of a patient, or the head coil is a combined local head/neck coil for recording images of the head and neck of the patient.

* * * * *